United States Patent [19]

Schmidt et al.

[11] 4,154,980
[45] May 15, 1979

[54] NOISE BLANKER WITH VARIABLE RATE-SHUT-OFF AND/OR VARIABLE BLANKING THRESHOLD LEVEL

[75] Inventors: Ruediger Schmidt, Elmwood Park; Herbert Duncan, Schaumburg, both of Ill.

[73] Assignee: Motorola, Inc., Schaumburg, Ill.

[21] Appl. No.: 828,364

[22] Filed: Aug. 29, 1977

[51] Int. Cl.² .......................... H04H 5/00; H04B 1/10
[52] U.S. Cl. ................................ 179/1 GD; 325/480; 325/473
[58] Field of Search ............. 179/1 P, 15 BT; 325/36, 325/473, 478, 480

[56] References Cited

U.S. PATENT DOCUMENTS

| | | | |
|---|---|---|---|
| 3,478,272 | 11/1969 | Rogers | 325/478 |
| 3,768,021 | 10/1973 | Ramaswamy et al. | 179/15 BT |
| 3,919,482 | 11/1975 | Hamada | 179/15 BT |
| 3,961,268 | 6/1976 | Hansen | 325/478 |
| 4,006,419 | 2/1977 | Liman | 325/478 |

Primary Examiner—Kathleen H. Claffy
Assistant Examiner—Kenneth A. Chayt

Attorney, Agent, or Firm—James W. Gillman; Phillip H. Melamed

[57] ABSTRACT

A noise blanker circuit for a stereo radio receiver is disclosed herein. The noise blanker circuit detects noise impulses in a received radio signal. When the magnitudes of these detected noise impulses exceed a predetermined threshold level corresponding noise blanking pulses are produced which are coupled to a gate means. The gate means receives the received radio signal and selectively passes and blocks this signal in response to the noise blanking pulses such that the output of the gate means is essentially free of noise impulses. A manually adjusted actuator is provided for selectively altering the predetermined threshold level of the noise blanker circuit such that the most efficient mode of noise blanking can be implemented. In addition, rate shut-off circuitry is provided to prevent the production of noise blanking pulses when the detected noise impluses occur at a repetition rate exceeding a maximum repetition rate. The manually adjustable actuator is illustrated as comprising either the tone control actuator or the stereo-monaural selection switch actuator of a radio receiver. Another embodiment shows automatic threshold level and/or repetition rate selection linked to stereo signal indication.

17 Claims, 6 Drawing Figures

NOISE BLANKER WITH VARIABLE RATE-SHUT-OFF AND/OR VARIABLE BLANKING THRESHOLD LEVEL

BACKGROUND OF THE INVENTION

The present invention generally relates to the field of noise blanking circuits in which noise impulses in a received signal are essentially eliminated by detecting these noise impulses and producing blanking pulses in response thereto which are used to prevent the passage of these noise impulses to a subsequent signal processing stage by blanking the received signal during the occurrence of the noise impulses. The present invention more particularly relates to such a noise blanker circuit used in a stereo radio receiver and such a noise blanker circuit which includes rate shut-off circuitry that prevents noise blanking action whenever highly repetitive noise impulses are detected.

The concept of eliminating noise from a received signal by producing corresponding blanking pulses which prevent the passage of noise impulses to a subsequent signal processing stage is well-known to those skilled in the art. Such noise blanking circuits are illustrated in U.S. Pat. Nos. 3,191,123, 3,284,714, and 3,699,457 all of which are assigned to MOTOROLA, Inc., the assignee of the present invention. Such noise blanking circuits generally detect noise impulses in a received signal by multiple differentiation of the signal. These detected noise impulses are then coupled to an amplifying device such that whenever the magnitude of a detected noise impulse exceeds the turn on threshold of the amplifying device, a corresponding blanking pulse will be produced. The blanking pulse is then coupled to a gate circuit which receives the input signal containing noise and passes this signal whenever a noise blanking pulse is not being produced. Typically a delay circuit is provided for delaying the time at which the noise containing input signal is received at the gate means such that a noise impulse will be received at the gate means at the same time that its corresponding noise blanking pulse is received by the gate means. In this manner the blanking pulse will prevent the gate means from passing the noise impulse.

Some noise blanking systems include rate shut-off circuitry which senses when the received signal contains noise impulses that occur at a rate in excess of a maximum predetermined rate. Under such conditions, the rate shut-off circuitry will prevent or inhibit the noise blanking circuit from producing noise blanking pulses. This can be desirable since otherwise the noise blanking pulses could result in totally blanking the received input signal such that no signal would be passed by the gate means whenever noise impulses in the received signal occurred at a rate exceeding the maximum predetermined rate. Thus without any rate shut-off circuitry it would be possible for the operator of a radio receiver to be totally unaware of a received radio transmission in which the received signal had a very high noise impulse repetition rate.

Some prior art noise blanking systems do sense the magnitude of the signal being received and use this information to decrease the threshold sensitivity of the noise blanker such that the noise blanker is prevented from generating blanking pulses whenever the magnitude of the detected noise impulses is relatively low compared to the magnitude of the input information signal which contains these noise impulses. In addition, some prior art noise blankers have been provided with a manual actuator for turning the noise blanking circuitry on and off.

Basically, the above mentioned prior art noise blanker systems have not provided any way to selectively alter the operation of the noise blanker circuit to obtain the most efficient mode of noise blanking for any particular type of noise impulse interference. For example, when the operator of a radio receiver is listening to a broadcasted musical composition and random small magnitude noise impulses are present, the most efficient mode of noise blanking to produce a noise free signal may correspond to adjusting the threshold level of the noise blanker such that it will blank even the smallest magnitude noise impulses, whereas if a great number of these noise impulses are present the most efficient mode of noise blanking to obtain a pleasing sound for the operator of the radio receiver may be obtained by having a slightly higher noise blanker threshold. In addition, noise blanker rate shut-off circuits are generally designed such that substantially no blanking will occur or only blanking of random large magnitude noise impulses will occur whenever the rate of repetition of noise impulses exceeds a maximum predetermined rate. This maximum rate is a function of the circuit design of the noise rate shut-off circuitry and represents an estimate as to when the operation of the noise blanker circuit should be shut off or altered in response to the occurrence of noise impulses which occur at a highly repetitive rate. For many types of information signals with noise impulse disturbances, this estimated maximum repetition rate at which the noise blanker circuit will be de-activated by the rate shut-off circuitry will not produce the most efficient mode of noise blanking. However, prior art noise blanker circuits have ignored this problem and have provided no way of altering the operation of the rate shut-off circuitry such that noise blanking of highly repetitive noise can be selectively implemented to obtain the most desirable mode of noise blanking operation.

SUMMARY OF THE INVENTION

An object of the present invention is to provide a noise blanker circuit which overcomes the aforementioned deficiencies.

A more particular object of the present invention is to provide a noise blanker circuit in which one of several operative modes of the noise blanker circuit can be selected by manually adjusting an actuator.

A further object of the present invention is to provide a noise blanker circuit in a radio receiver in which one of several modes of operation of the noise blanker circuit is selected in response to the detection of a stereo pilot carrier signal by the radio receiver.

Another object of the present invention is to provide a noise blanker circuit in which the mode of operation of a noise blanker rate shut-off circuit can be selectively altered to obtained a more readily intelligible information signal.

In one embodiment of the present invention an improved noise blanker circuit for eliminating noise in a received signal is provided. The noise blanker circuit comprises; noise detection means for receiving an input signal which may be accompanied by noise impulses having various magnitudes and detecting said noise impulses; blanking pulse generating means coupled to said noise detection means for producing corresponding blanking pulses in response to the magnitudes of said detected noise impulses exceeding a predetermined threshold level; gate means coupled to said pulse generating means for receiving said input signal and said blanking pulses and selectively passing and blocking said input signal in response to said blanking pulses; and control means coupled to said blanking pulse generating means and including a manually adjustable actuator having at least two positions for setting said predetermined threshold level of said blanking pulse generating means to at least two distinct operative threshold levels for generating blanking pulses, said two levels corresponding, respectively, to the two positions of said manually adjustable actuator; whereby the signal selectively passed by said gate means is essentially free of noise impulses and the manually adjustable actuator permits selecting the most efficient noise blanking mode of operation.

Preferably, the manual actuator would correspond to a tone control actuator of a radio receiver which produces the input signal. The correspondence would be such that when the tone control actuator selectively emphasizes the base tones of a received signal, the threshold level of the noise blanker would be adjusted such that small magnitude detected noise impulses would create noise blanking pulses. In response to the tone control actuator emphasizing the treble frequencies, the noise threshold level would be adjusted such that noise blanking pulses would only be created in response to larger magnitude detected noise impulses. In this manner, an existing manual actuator of a radio receiver is utilized to selectively control the operation of the noise blanker circuit. Since emphasizing base frequencies will typically minimize the effect of any unblanked noise impulses on a radio speaker, the present invention utilizes a single manual actuator to provide a dual improvement in noise blanking. The present invention also describes how the manual actuator may correspond to the stereo-monaural selection switch actuator of a radio receiver. Once again, an existing control on the radio receiver is utilized to selectively implement several modes of operation for the radio receiver and noise blanker circuit. Thus the present invention has eliminated the need for providing a separate additional manual actuator to adjust the mode of operation of the noise blanker circuit.

The present invention also provides a noise blanker circuit with a controllable rate shut-off means for eliminating noise in a received signal. This noise blanker circuit comprises; noise detection means for receiving an input signal which may be accompanied by noise impulses having various magnitudes and detecting said noise impulses; blanking pulse generating means coupled to said noise detection means for producing corresponding blanking pulses in response to the magnitudes of said detected noise impulses exceeding a predetermined threshold level, said blanking pulse generating means including rate shut-off means for permitting the production of blanking pulses by said detected noise impulses with a predetermined magnitude only when the repetition rate of these detected noise pulses is below a selected maximum repetition rate; gate means coupled to said pulse generating means for receiving said input signal and said blanking pulses and selectively passing and blocking said input signal in response to said blanking pulses; and control means coupled to said rate shut-off means for selectively providing any of at least two distinct rates for said maximum repetition rate during the operation of said blanking pulse means; whereby noise blanking of highly repetitive noise can be selectively implemented by said control means whenever such blanking may be desirable. Therefore in this noise blanker circuit, the effect of the noise rate shut-off circuitry can be selectively modified to produce an optimum mode of operation for the noise blanker circuit.

Another feature of the present invention is that the threshold level of a noise blanker circuit can be automatically modified in response to the detection of a stereo pilot carrier signal by a stereo decoder. In this manner, whenever a strong stereo signal is detected such that the stereo decoder would activate the stereo indicating light, the threshold level of the noise blanker circuit will implement one mode of noise blanking operation, whereas when the stereo decoder does not detect a strong enough stereo pilot carrier signal to activate the stereo indicating light, another mode of noise blanking operation will be automatically selected. Therefore the mode of operation of the noise blanker circuit is selectively altered in accordance with the stereo decoder determining whether or not a strong enough stereo signal is being received. For strong received stereo signals generally a high threshold level for the noise blanker would be selected such that only very large magnitude noise impulses would result in noise blanking. However, for weak received stereo signals a lower noise blanking threshold level would be desirable and is selected by the present invention. This feature of the present invention utilizes the selective altering of the noise blanker threshold level to enhance the characteristically higher signal-to-noise ratio that is produced inherently during the reception of monaural signals or weak stereo signals in which the stereo decoder is unable to detect the presence of a stereo pilot carrier signal.

BRIEF DESCRIPTION OF THE DRAWINGS

For a more complete understanding of the invention reference should be made to the drawings, in which.

DESCRIPTION OF THE PREFERRED EMBODIMENTS

Figure 1:
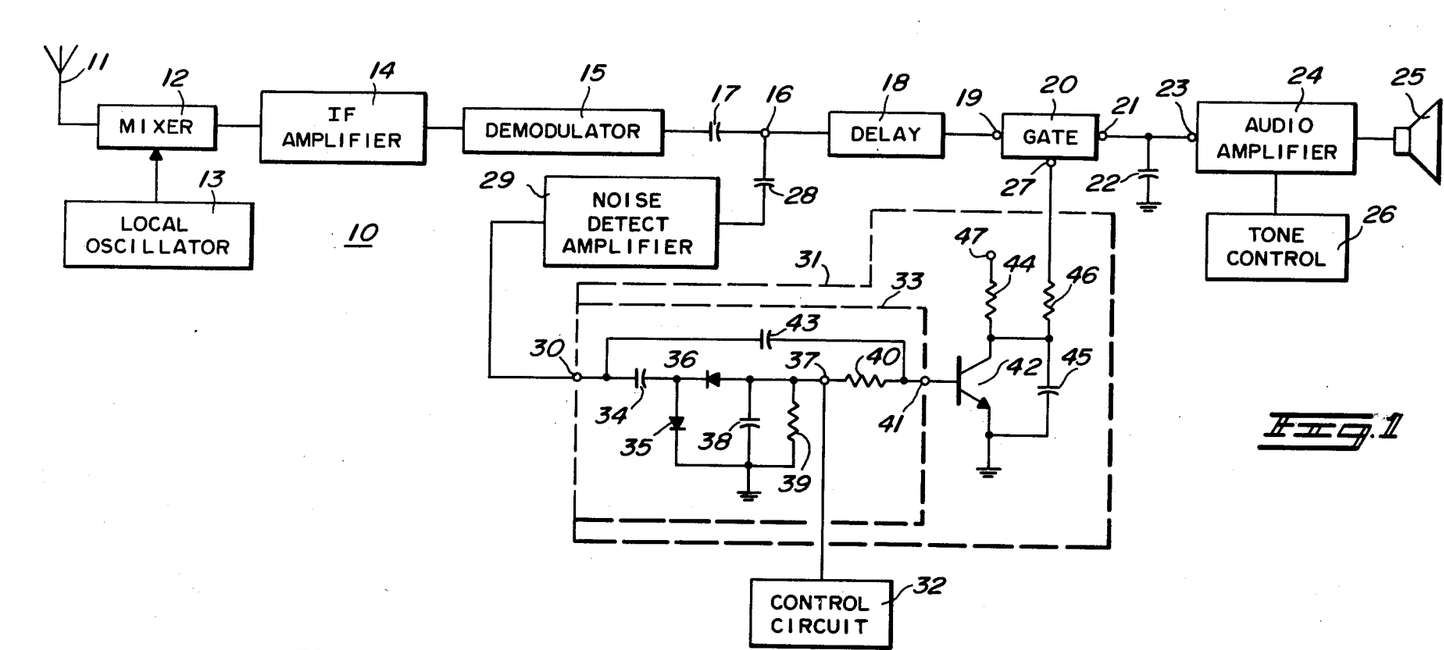
FIG. 1 is a block and schematic diagram of a radio receiver having a noise blanking circuit with rate shut-off circuitry.

Referring to FIG. 1, a stereo radio receiver 10 is illustrated. The receiver includes an antenna 11 coupled to a frequency mixer 12 which receives a local oscillator frequency signal from a local oscillator 13. The output of the mixer 12 is coupled to an IF amplifier 14 whose output is coupled to a demodulator 15. The output of the demodulator 15 is coupled to an input terminal 16 through a coupling capacitor 17. The operation and construction of the components 11 through 17 is well known and therefore will not be discussed in any detail. Basically the local oscillator 13 and the mixer 12 tune the radio receiver 10 to a desired frequency by mixing the signals received by the antenna 11 with the output of the local oscillator 13 to create an IF frequency signal for the highly selective IF amplifier 14. The demodulator 15 receives the amplified IF frequency signal and produces an audio output signal which may be accompanied by noise impulses having various magnitudes. This audio output signal is coupled to the input terminal 16 through the coupling capacitor 17.

The input terminal 16 is coupled through a delay circuit 18 to an input terminal 19 of an audio gate 20. The gate has an output terminal 21 coupled to ground through a holding capacitor 22 and coupled to an input terminal 23 of an audio amplifier 24. The output of the audio amplifier 24 is coupled to a speaker 25 and the frequency response of the audio amplifier 24 is controlled by a tone control device 26.

Essentially, the delay circuit 18 provides a predetermined amount of audio delay between the terminals 16 and 19. The gate 20 selectively passes the audio signal at the terminal 19 to the terminal 21 in accordance with blanking control signals received at a control terminal 27 of the gate 20. When the gate 20 blocks the passage of signals between the terminals 19 and 21, the holding capacitor 22 maintains the signal level at the terminal 21 constant so that a large discontinuity during the blocking of signals by the gate 20 is not encountered. The use of a capacitor in this manner in a noise blanking circuit is known and is illustrated in a U.S. Pat. No. 2,151,773. The gate 20 merely represents a controllable switch in which the terminals 19 and 21 are short-circuited during the presence of a positive voltage signal at the terminal 27 and are open-circuited during the presence of low voltage blanking pulses at the terminal 27. The delay circuit 18 is merely a delay designed to delay the passage of signals between the terminals 16 and 19 such that noise impulses at the terminal 16 will arrive at the terminal 19 at the same time that a corresponding noise blanking pulse will be produced at the terminal 27. The previously mentioned U.S. Pat. No. 2,151,773 also illustrates the use of such a delay circuit. The delay circuit 18 and the gate 20 together form a gate means which receives a noise containing input signal and blanks this signal in accordance with received blanking pulses.

The input terminal 16 is coupled through a differentiating capacitor 28 to a noise detector amplifier 29. The noise detector amplifier 29 detects the existence of noise impulses by preferably performing another differentiation operation and amplifying the twice differentiated signal to produce an output comprising detected noise impulses having various magnitudes. The output of the noise amplifier 29 is coupled to an output terminal 30. A noise blanking pulse generating circuit means (shown dashed) is designated by the reference number 31. The blanking pulse circuit 31 is coupled to the output terminal 30 of the noise detector amplifier 29 and produces corresponding blanking pulses in response to the magnitudes of the detected noise impulses present at the terminal 30 exceeding a predetermined threshold level. The blanking pulse generating circuit 31 then supplies these blanking pulses to the control terminal 27 of the gate 20 to implement a noise blanking function for the radio receiver 10. A control circuit 32, shown in block form in FIG. 1, is coupled to the blanking pulse generating circuit 31 and controls various modes of operation of the blanking pulse generating circuit 31 in a manner to be described subsequently.

The blanking pulse generating means 31 includes rate shut-off circuitry 33 (shown dashed) which permits the production of blanking pulses in response to detected noise impulses with a predetermined magnitude at the terminal 30 only when the repetition rate of these detected noise pulses is below a selected maximum repetition rate. The rate shut-off circuit 33 includes a capacitor 34 coupled between the terminal 30 and the anode of a diode 35 having its cathode directly connected to ground. A diode 36 has its cathode connected to the anode of the diode 35 and its anode directly connected to a control terminal 37 which is coupled to ground through a parallel connection of a capacitor 38 and a resistor 39. The terminal 37 is directly connected to the control circuit 32 and is connected through a resistor 40 to an input terminal 41 that corresponds to the base of an NPN amplifying transistor 42. The terminal 41 is also coupled to the terminal 30 via a capacitor 43. The rate shut-off circuitry 33 comprises the elements 34 through 41 and capacitor 43.

The collector of the transistor 42 is coupled to a positive supply voltage terminal 47 through a resistor 44, to ground through a capacitor 45 and to the control terminal 27 through a resistor 46. The emitter of the transistor 42 is directly coupled to ground. The components 33 through 46 comprise the blanking pulse generating circuit 31.

Essentially, the amplifying transistor 42 is turned on by detected noise impulses at the terminal 41 which exceed the base-emitter threshold level of the transistor 42, typically 0.7 volts. When the transistor 42 is turned on, the collector of the transistor is shorted to ground and this totally discharges the voltage developed across the capacitor 45. Subsequently, the capacitor 45 is charged up to the voltage at the terminal 47 through the charging resisitor 44. While the capacitor 45 is being charged, a relatively low voltage is supplied to the control terminal 27 through the resistor 46 and this results in actuating the blanking gate 20 such that signals present at the terminal 19 are prevented from passing through the gate 20 to the terminal 21. Thus detected positive noise impulses at terminal 41 which exceed the threshold level of the transistor 42 will result in producing blanking pulses that are coupled to the control terminal 27. It should be noted that the duration of the blanking pulse depends on the magnitudes of resistor 44 and capacitor 45. It should also be noted that the threshold level of the transistor 42 represents the base-emitter turn on voltage of this transistor pulse whatever DC bias level is applied to the terminal 41 through any biasing circuitry. Basically, the rate shut-off circuit 33 superimposes a negative bias on the terminal 41 in response to highly repetitive detected noise impulses such that these impulses will be unable to turn on the transistor 42. The operation of the rate shut-off circuit 33 will now be discussed in detailed.

Detected and amplified noise impulses are provided at the terminal 30 by the noise detector amplifier 29. These impulses have various magnitudes related to the strength of the noise impulses at the terminal 16, and the impulses will be of both positive and negative polarity. These impulses are passed by the capacitor 34 and rectified by the diodes 35 and 36 to produce a negative bias voltage at the terminal 37 related to the repetition rate of the negative noise impulses at the terminal 30. This occurs because the negative noise impulses passed by the capacitor 34 forward bias the diode 36 and therefore act to maintain the side of the capacitor 38 coupled to the terminal 37 at a voltage below ground. Positive noise impulses passed by the capacitor 34 are shunted directly to ground through the diode 35 and are prevented from affecting the negative voltage at the terminal 37 by the polarity of the diode 36. The magnitudes of the resistor 39 and the capacitor 38 determine the relationship between the repetition rate of negative noise impulses passed by the capacitor 34 and the magnitude of the negative bias voltage produced in response thereto at the terminal 37.

The negative voltage at the terminal 37 biases the terminal 41 to a negative voltage via the resistor 40. Positive and negative detected noise impulses are coupled to the terminal 41 through the coupling capacitor 43. For any of these positive noise impulses to turn on the transistor 42, the magnitude of these positive noise impulses must exceed not only the 0.7 volt base-emitter threshold voltage of the transistor 42 but also the negative bias at the terminal 41 produced in response to the voltage at the terminal 37 and therefore in response to the repetition rate of the negative noise impulses. The 0.7 volt base-emitter transistor threshold voltage and the bias at the terminal 41 combine to create a predetermined threshold level for the blanking pulse generating circuit 31 which depends on noise impulse repetition rate. In this manner the rate shut-off circuit 33 permits the transistor 42 to produce blanking pulses in response to detected noise impulses at the terminal 41 having a predetermined magnitude only when the repetition rate of detected noise impulses is below a maximum repetition rate determined by the magnitudes of the resistor 39 and the capacitor 38. Thus for high repetition rates of noise impulses above the maximum repetition rate, a large negative bias voltage will be produced at the terminal 37 and positive noise impulses coupled through the capacitor 43 to the terminal 41 will be unable to turn on the transistor 42 to create noise blanking pulses. It should be noted that for every noise disturbance at the terminal 16, both a positive and negative noise impulse is created due to the multiple differentiation performed by capacitor 38 and amplifier 29.

The present invention contemplates providing several embodiments of the control circuit 32 which will alter the operation of the blanking pulse generating circuit 31 so that an optimum mode of noise blanking can be implemented. Essentially, the present invention provides for selectively altering the bias created at the terminal 37 such that an optimum mode of noise blanking may be implemented. Specific embodiments of the control circuit 32 are illustrated in FIGS. 2 through 6 in which identical reference numbers have been used to identify corresponding components. The embodiments shown in FIGS. 2 through 6 will now be discussed in detail.

Figure 2:
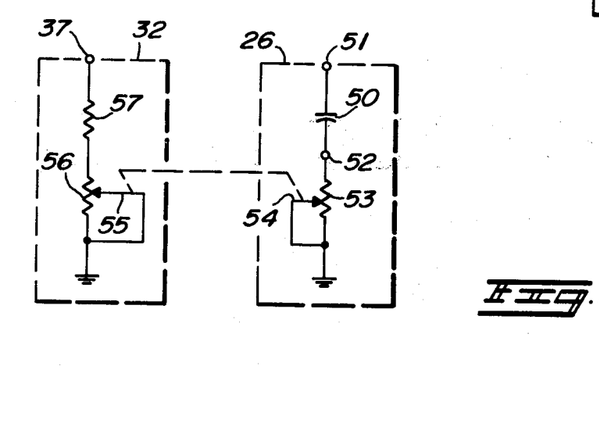
FIG. 2 is a schematic diagram illustrating an embodiment of a control circuit and a tone control device shown in block form in FIG. 1.

Referring to FIG. 2, a preferred embodiment of the tone control device 26 and the control circuit 32 is illustrated. The tone control device 26 is shown as comprising a capacitor 50 having an first end terminal 51 and a second end terminal 52 that is coupled to ground through a variable resistor 53 having a manually adjustable actuator arm generally designated by the reference number 54. The actuator arm 54 is illustrated as being mechanically coupled to an adjustable actuator arm 55 of a variable resistive element 56 coupled in series with a fixed resistor 57 between the terminal 37 and ground. The positions of the actuators 54 and 55 are simultaneously adjustable due to their mechanical coupling. The components 50 through 54 comprise the tone control device 26 and the components 55 through 57 comprise the control circuit 32.

Essentially, the tone control device 26 comprises a shunt frequency sensitive bypass network in which the magnitude of the resistance between the terminal 52 and ground (which is controlled by the position of the manually adjustable actuator 54) determines the amount of high frequency signals that are bypassed by the tone control device 26. By coupling the terminal 51 directly to the terminal 23 shown in FIG. 1, the input to the audio amplifier 24 will be modified according to the tone control device 26 and control of the frequency output of the amplifier 24 will be implemented.

As the frequency response of the amplifier 24 is controlled by the device 26, simultaneously the resistance provided by the elements 56 and 57 between the terminal 37 and ground is changed. Changing this resistance will modify the relationship between the noise impulse repetition rate and the negative voltage produced at the terminal 37 in response to the noise impulse repetition rate. In this manner an infinite number of discrete maximum repetition rates for the rate shut-off circuit 33 can be implemented by the present invention since the resistance between terminal 37 and ground determines the maximum repetition rate.

Actually, adjusting the magnitude of the variable resistance element 56 by manually adjusting the actuator 54 of the tone control device 26 also results in producing a corresponding infinite number of threshold levels for the blanking pulse generating circuit 31. This is because the threshold level of the blanking pulse generating circuit 31 comprises the base-emitter turn on threshold of the transistor 42 and the negative bias provided at the terminal 37 by the rate shut-off circuit 33. Essentially the control circuit 32 provides a manually adjustable actuator, which corresponds to the tone control actuator of the device 26, which can implement an infinite number of threshold levels for the blanking pulse generating circuit 31 by providing an adjustable bias in response to a predetermined repetition rate of detected noise impulses. Thus the embodiment illustrated in FIG. 2 enables the operator of the radio receiver 10 to select an optimum blanking mode of operation to obtain the maximum intelligibility of the signal produced by the speaker 25 by merely adjusting the manual actuator of the tone control device 26.

Figure 3:
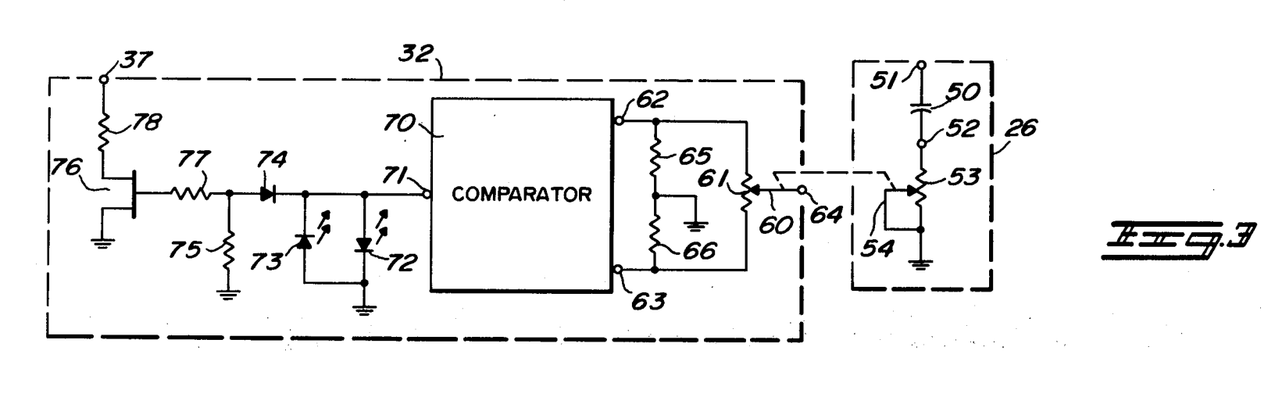
FIG. 3 is a block and schematic diagram illustrating another embodiment of the control circuit and tone control device illustrated in FIG. 1.

Referring to FIG. 3, another similiar embodiment of the control circuit 32 is illustrated in conjunction with an embodiment of the tone control device 26 that is identical to the embodiment shown in FIG. 2. The manually adjustable tone control actuator 54 in FIG. 3 is mechanically coupled to an adjustable center tap arm 60 of a potentiometer for simultaneous control thereof. The potentiometer has a resistive element 61 with its end portions directly coupled to terminals 62 and 63, respectively. The adjustable center tap arm 60 is directly electrically connected to a reference terminal 64 at which a fixed reference potential is applied. Resistors 65 and 66 are connected between the terminals 62 and 63, respectively, and ground. A DC voltage comparator 70 receives inputs from the terminals 62 and 63, compares the voltages at these terminals and produces an output signal at an output terminal 71. The anode of a light emitting diode 72 and the cathode of a light emitting diode 73 are coupled to the terminal 71 and the opposite electrodes of these two light emitting diodes are coupled to ground. In addition, the cathode of a diode 74 is connected to the terminal 71 and the anode of this diode is coupled to ground through a resistor 75 and to the gate of a field effect transistor 76 through a resistor 77. One of the source and drain electrodes of the field effect transistor 76 is connected to ground and the other is connected through a resistor 78 to the terminal 37. The components 60 through 78 comprise the control circuit 32 shown in FIG. 3.

Essentially, adjusting the manual actuator 54 of the tone control device 26 in the embodiment shown in FIG. 3 results in changing the relative magnitudes of the voltages present at the terminals 62 and 63. The comparator 70 compares these magnitudes and when the voltage of the terminal 63 exceeds the voltage at the terminal 62, a negative voltage is produced at the terminal 71. This negative voltage will turn on the light emitting diode 73 and shut off the field effect transistor 76 via diode 74. In response to the voltage of the terminal 62 exceeding the voltage at the terminal 63, the comparator 70 will produce a positive voltage at the terminal 71 which will turn on the light emitting diode 72 and apply a zero bias to the gate of the field effect transistor 76 resulting in turning on this device. The net effect of this is to couple the resistor 78 in parallel with the resistor 39 shown in FIG. 1.

Basically, FIG. 3 provides two distinct operative noise blanking modes for the blanking pulse generating circuit 31. When the tone control actuator 54 is adjusted to emphasize low frequency signals over high frequency signals by selectively shunting these high frequency signals to ground at the input of the audio amplifier 24, the comparator 70 will excite the light emitting diode 72 and a lower value of resistance will be provided between the terminal 37 and ground. This results in altering not only the maximum repetition rate of impulse noise allowed by the rate shut-off circuit 33, but also results in effectively altering the threshold level of the blanking pulse generating circuit 31 whenever a negative bias voltage had previously been created at the terminal 37 by repetitive noise impulses.

In the present invention, it is contemplated that when the tone control actuator 54 in FIGS. 2 or 3 is adjusted so as to emphasize low frequency signals over higher frequency signals, the threshold level of the blanking pulse generating circuit 31 will be adjusted such that detected noise impulses having smaller magnitudes will now exceed the adjusted predetermined threshold level and will therefore now result in producing blanking pulses. Thus when the frequency response of the audio amplifier 24 is adjusted so as to eliminate high frequencies, the threshold level of the noise blanking circuit is simultaneously adjusted such that even smaller detected noise impulses will result in producing noise blanking pulses. The result is a dramatic increase in the clarity of the audible signal produced by the speaker 25. This is because noise impulses generally comprise high frequency signals. Thus by attenuating the high frequency response of the amplifier 24 some noise immunity is already provided. In cases where the presence of noise impulses does not impair the intelligibility of the signal produced by the speaker 25, the actuator 54 of the tone control device 26 can be adjusted such that the treble response of the audio amplifier 24 is restored and noise blanking occurs only for large magnitude noise impulses.

Figure 4:
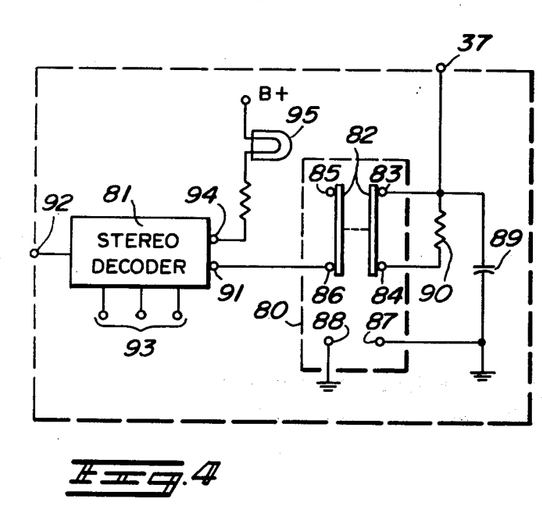
FIG. 4 is a block and schematic diagram illustrating an additional embodiment of the control circuit shown in block form in FIG. 1.

Referring now to FIG. 4, another embodiment of the control circuit 32 is illustrated as including a stereomonaural selection switch 80 (shown dashed) for the radio receiver 10. The switch 80 is contemplated as controlling the activation of a stereo decoder 81 which in turn determines whether or not the receiver 10 will be able to reproduce received signals in two discrete channels. The selection switch 80 comprises a manually adjustable slide switch actuator 82 which in one position couples internal switch terminals 83 and 84 together while simultaneously coupling internal terminals 85 and 86 together. In another position of the slide switch actuator 82, internal switch terminals 84 and 87 are connected to each other and internal terminals 86 and 88 are connected together. The terminal 83 is directly connected to terminal 37, coupled to ground through a capacitor 89 and coupled to the terminal 84 through a resistor 90. The terminals 87 and 88 are each connected to ground. The terminal 86 is directly connected to an on/off control terminal 91 of the stereo decoder 81. The stereo decoder also has an input terminal 92 for receiving undecoded input signals, a plurality of outputs terminals 93 for providing single or multiple channel decoded outputs to subsequent amplifiers and/or speakers and an output terminal 94 at which an electrical signal is produced which is used to selectively excite a stereo indicator lamp 95 coupled between a B+ positive supply terminal and the output terminal 94. The components 82 through 95 comprise the embodiment of the control circuit 32 shown in FIG. 4.

The operation of stereo decoders similiar to the decoder 81 is well-known to those skilled in the art and therefore will not be discussed in detail. Basically the decoder 81 receives an undecoded signal at its input terminal 92 and, when the decoder is enabled by a proper signal being applied to the control terminal 91, the decoder produces either a single or multiple channel output signal at its output terminals 93 in response to whether the decoder 81 has detected the presence of a stereo pilot carrier signal in the signal being received at the terminal 92. Also in response to the detection of a stereo pilot carrier signal, a low potential is applied to the terminal 94 which results in activating the stereo indicator light 95 so as to alert the operator of the radio receiver 10 that a stereo signal is being received.

In the embodiment shown in FIG. 4, the present invention provides for utilizing the manual actuator of the stereo-monaural selection switch 80 to select one of two different operative modes for the blanking pulse generating circuit 31. With no voltage applied to the control terminal 91 of the decoder 81, the stereo decoder 81 is allowed to process and decode stereo received signals. This corresponds to the position of the manual actuator 82 shown in FIG. 4. In this position, the noise blanking circuit shown in FIG. 1 functions in a first operative mode. When the manual actuator 82 is slide so as to short out the terminals 86 and 88 as well as the terminals 84 and 87, the stereo decoder 81 is deactivated. This results in inherently improving the signal to noise ratio of the signal produced by the stereo decoder 81 at one of the terminals 93. It is contemplated that this terminal having the improved signal to noise ratio will be the terminal that will now be coupled to the input terminal 23 of the audio amplifier 24. Simultaneously, the terminal 37 is now coupled to ground through the resistor 90. This results in reducing the resistance between the terminal 37 and ground, and this in turn results in altering the noise blanking threshold level of the blanking pulse circuit 31 and the predetermined maximum allowable repetition rate of the rate shut-off circuit 33 so as to permit more noise blanking. These latter two functions are accomplished in the same manner as that discussed in connection with the embodiments shown in FIGS. 2 and 3. Thus the embodiment in FIG. 4 illustrates how the stereo-monaural selection switch actuator of a radio can be used to alter the mode of operation of a noise blanking circuit so as to enable the operator to select the most efficient mode of noise blanking.

Figures 5, 6:
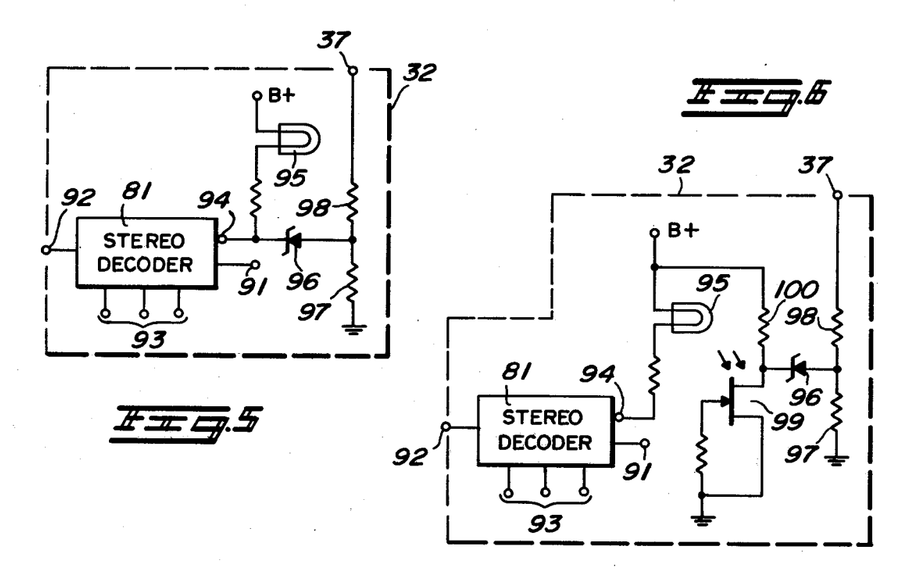
FIG. 5 is a block and schematic diagram illustrating another embodiment of the control circuit shown in FIG. 1.
FIG. 6 is a block and schematic diagram illustrating still another embodiment of the control circuit shown in FIG. 1.

FIG. 5 illustrates a further embodiment of the present invention in which another construction for the control circuit 32 is illustrated. In FIG. 5, the stereo decoder 81 and its terminals 91 through 94, as well as the indicating light 95, function exactly as previously described in connection with FIG. 4. In FIG. 5, a zener diode 96 has its cathode directly connected to the terminal 94 and its anode connected to ground through a resistor 97 and connected to the terminal 37 through a resistor 98. When the stereo decoder 81 detects the presence of the stereo pilot carrier signal in the signal present at the terminal 92, a low voltage is produced at the terminal 94 which results in exciting the stereo indicating lamp 95. With this low voltage at the terminal 94, the zener diode 96 is substantially an open circuit and the terminal 37 is therefore connected to ground through the resistor 39 in parallel with the series connection of the resistors 98 and 97. This results in selecting one mode of operation for the noise blanker circuit shown in FIG. 1. When the decoder 81 does not detect the presence of a stereo pilot carrier signal, no low voltage is applied to the terminal 94 by the decoder 81. This results in having a relatively high voltage present at the terminal 94, and this high voltage results in breaking down the zener diode 96 and applying a positive small voltage to the junction between the resistors 97 and 98. This small positive voltage is coupled to the terminal 37 through the resistor 98 and results in decreasing the threshold level of the noise blanking pulse generating circuit 31. This also results in allowing the noise blanker to blank repetitive noise impulses which occur at a higher rate, since effectively this changes the maximum predetermined rate at which the noise blanking circuit will be disabled by the rate shut-off circuit 33.

Essentially, the embodiment illustrated in FIG. 5 results in setting the threshold level of the blanking pulse generating circuit 31 to one predetermined level in response to the detection of a pilot carrier signal and otherwise setting the threshold level to a second level in response to the non-detection of a pilot carrier signal. Since the decoder 81 only detects a pilot carrier signal when the pilot carrier is strong enough to be detected, the embodiment shown in FIG. 5 essentially utilizes the signal strength indication produced at terminal 94 to alert the blanking pulse generating circuit 31 to the fact that a weak signal is being received in which a lower threshold level and a higher maximum blanking rate would be desirable. Thus combining the control circuit 32 embodiment shown in FIG. 5 with the radio receiver 10 shown in FIG. 1 results in automatically modifying the operative mode of the noise blanking circuit of a ratio receiver by utilizing the stereo indicating light drive signal to select a proper mode of noise blanking operation.

Referring now to FIG. 6, an embodiment of the control circuit 32 which functions substantially identically to the embodiment shown in FIG. 5 is illustrated. In FIG. 6, the control circuit 32 again comprises the stereo decoder 81 and the stereo indicating light 95 and these components operate as previously described. In FIG. 6 however, the stereo indicating light drive signal present at the terminal 94 is not directly electrically coupled to the cathode of the zener diode 96. Instead, the stereo indicating light 95 is operatively coupled to a light sensitive field effect transistor 99 which has one of its drain and source electrodes connected to ground and the other connected to the cathode of the zener diode 96 and also connected to the B+ supply terminal through a resistor 100.

For the embodiment illustrated in FIG. 6, the overall functional operation of the control circuit 32 is identical of that of the embodiment shown in FIG. 5. However, in FIG. 6 the light given off by the stereo indicating light 95 is used to selectively turn on the field effect transistor 99 so as to implement two different modes of operation for the blanking pulse generating circuit 31 and the rate shut-off circuit 33. With no stereo pilot carrier signal being detected, the light 95 is off and so is the field effect transistor 99. This result in turning on the zener diode 96 by way of the resistor 100. When the light 95 is excited via the stereo decoder 81, the field effect transistor 99 will be turned on and this results in grounding the cathode of the zener diode 96 such that no positive potential can be passed by this diode to the junction between the terminals 97 and 98. Thus the embodiment in FIG. 6 functions to selectively implement two distinct modes of operation for a noise blanking circuit and these modes of operation are derived in accordance with the excitation state of the stereo indicating light of a radio receiver.

While we have shown and described specific embodiments of the present invention, further modifications and improvements will occur to those skilled in the art. All such modifications which retain the basic underlying principles disclosed and claimed herein are within the scope of this invention.

We claim:

1. A noise blanker circuit for eliminating noise in a received signal, comprising:
   noise detection means for receiving an input signal which may be accompanied by noise impulses having various magnitudes and detecting said noise impulses;
   blanking pulse generating means coupled to said noise detection means for producing corresponding blanking pulses in response to the magnitudes of said detected noise impulses exceeding a predetermined threshold level;
   gate means coupled to said pulse generating means for receiving said input signal and said blanking pulses and selectively passing and blocking said input signal in response to said blanking pulses; and
   control means coupled to said blanking pulse generating means and including a manually adjustable actuator having at least two positions for setting said predetermined threshold level of said blanking pulse generating means to at least two distinct operative threshold levels for generating blanking pulses, said two levels corresponding, respectively, to the two positions of said manually adjustable actuator;
   wherein said manually adjustable actuator is a tone control actuator of a radio receiver which produces said input signal;
   whereby the signal selectively passed by said gate means is essentially free of noise impulses and the manually adjustable actuator permits selecting the most efficient noise blanking mode of operation.

2. A noise blanker circuit according to claim 1 wherein when said tone control actuator is positioned to emphasize low frequency signals over high frequency signals, only detected noise impulses of at least a first magnitude and having a predetermined repetition rate will exceed said predetermined threshold level, and when said tone control actuator is positioned to emphasize high frequency signals over low frequency signals, only detected noise impulses of at least a second magnitude with said predetermined repetition rate will exceed said threshold level, said first magnitude being smaller than said second magnitude.

3. A noise blanker circuit according to claim 1 wherein said manually adjustable actuator is infinitely adjustable into an infinite number of positions for producing a corresponding infinite number of threshold levels for said blanking pulse generating means.

4. A noise blanker circuit according to claim 3 wherein when said tone control actuator is positioned to emphasize low frequency signals over high frequency signals, only detected noise impulses of at least a first magnitude and having a predetermined repetition rate will exceed said predetermined threshold level, and when said tone control actuator is positioned to emphasize high frequency signals over low frequency signals, only detected noise impulses of at least a second magnitude with said predetermined repetition rate will exceed said threshold level, said first magnitude being smaller than said second magnitude.

5. A noise blanker circuit for eliminating noise in a received signal, comprising:
noise detection means for receiving an input signal which may be accompanied by noise impulses having various magnitudes and detecting said noise impulses;
blanking pulse generating means coupled to said noise detection means for producing corresponding blanking pulses in response to the magnitudes of said detected noise impulses exceeding a predetermined threshold level;
gate means coupled to said pulse generating means for receiving said input signal and said blanking pulses and selectively passing and blocking said input signal in response to said blanking pulses; and
control means coupled to said blanking pulse generating means and including a manually adjustable actuator having at least two positions for setting said predetermined threshold level of said blanking pulse generating means to at least two distinct operative threshold levels for generating blanking pulses, said two levels corresponding, respectively, to the two positions of said manually adjustable actuator;
wherein said manually adjustable actuator is a stereo-monaural selection switch actuator of a radio receiver which produces said input signal;
whereby the signal selectively passed by said gate means is essentially free of noise impulses and the manually adjustable actuator permits selecting the most efficient noise blanking mode of operation.

6. In a radio receiver having a stereo decoder means for receiving an input radio signal which may be accompanied by noise impulses and detecting the presence of a stereo pilot carrier signal in said input signal, a noise blanker circuit for eliminating noise in the received radio input signal, comprising;

noise detection means for receiving an input radio signal which may be accompanied by noise impulses having various magnitudes and detecting said noise impulses;
blanking pulse generating means coupled to said noise detection means for producing corresponding blanking pulses in response to the magnitudes of said detected noise impulses exceeding a predetermined threshold level;
gate means coupled to said pulse generating means for receiving said input signal and said blanking pulses and selectively passing and blocking said input signal in response to said blanking pulses; and
control means including said stereo decoder means coupled to said blanking pulse generating means for setting said predetermined threshold level to a first level in response to the detection of a stereo pilot carrier signal, and otherwise setting said predetermined threshold level of said blanking pulse generating means to a second level;
whereby the signal selectively passed by said gate means is substantially free of noise impulses and the noise blanker sensitivity is automatically altered in accordance with whether a stereo or monaural signal has been detected by the stereo decoder means.

7. A noise blanker circuit according to claim 6 wherein said first level is greater than said second level.

8. A noise blanker circuit according to claim 6 wherein said stereo decoder means produces an electrical drive signal to selectively excite a stereo light in response to the detection of a stereo pilot carrier signal and said electrical drive signal is electrically coupled to said blanking pulse generating means for altering said predetermined threshold level thereof.

9. A noise blanker circuit according to claim 6 wherein said stereo decoder means selectively excites a stereo indicating light in response to the detection of a stereo pilot carrier signal and said indicating light is optically coupled to said blanking pulse generating means for setting said predetermined threshold level thereof.

10. A noise blanker circuit for eliminating noise in a received signal, comprising;
noise detection means for receiving an input signal which may be accompanied by noise impulses having various magnitudes and detecting said noise impulses
blanking pulse generating means coupled to said noise detection means for producing corresponding blanking pulses in response to the magnitudes of said detected noise impulses exceeding a predetermined threshold level, said blanking pulse generating means including rate shut off means for permitting the production of blanking pulses by said detected noise impulses with a predetermined magnitude only when the repetition rate of these detected noise pulses is below a selected maximum repetition rate;
gate means coupled to said pulse generating means for receiving said input signal and said blanking pulses and selectively passing and blocking said input signal in response to said blanking pulses; and
control means coupled to said rate shut off means for selectively providing any of at least two distinct rates for said maximum repetition rate during the operation of said blanking pulse means;

whereby noise blanking of highly repetitive noise can be selectively implemented by said control means to obtain optimum noise blanking.

11. A noise blanker circuit according to claim 10 wherein said rate shut off means includes circuitry for altering said threshold level in accordance with the repetition rate of said detected noise impulses.

12. A noise blanker circuit according to claim 11 wherein said control means includes means for selectively altering said threshold level simultaneously with selectively providing said two distinct rates for said maximum repetition rate.

13. A noise blanker circuit according to claim 10 wherein said control means includes a stereo decoder means for receiving said input signal and detecting the presence of a stereo pilot carrier signal in said input signal, and wherein one of said two distinct rates is selected for said maximum repetition rate in response to the detection of said pilot carrier signal and the other one of said two distinct rates is otherwise selected.

14. A noise blanker circuit according to claim 10 wherein said control means includes a manually adjustable actuator having at least two positions corresponding to said two distinct rates, respectively.

15. A noise blanker circuit according to claim 14 wherein said manually adjustable actuator is a tone control actuator of a radio receiver which produces said input signal.

16. A noise blanker circuit according to claim 14 wherein said manually adjustable actuator is infinitely adjustable into an infinite number of positions for producing a corresponding infinite number of distinct rates for said maximum repetition rate of blanking pulse generating means.

17. A noise blanker circuit according to claim 14 wherein said manually adjustable actuator is a stereo-monaural selection switch actuator of a radio receiver which produces said input signal.

* * * * *